(12) United States Patent
Rigali et al.

(10) Patent No.: US 6,245,189 B1
(45) Date of Patent: *Jun. 12, 2001

(54) HIGH THROUGHPUT PLASMA TREATMENT SYSTEM

(75) Inventors: Louis A. Rigali, Martinez; David E. Hoffman, Pittsburg; Keda Wang, Pleasant Hill, all of CA (US)

(73) Assignee: Nordson Corporation, Westlake, OH (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/012,743

(22) Filed: Jan. 23, 1998

Related U.S. Application Data

(63) Continuation-in-part of application No. 08/601,687, filed on Feb. 15, 1996, now abandoned, and a continuation-in-part of application No. 08/567,797, filed on Dec. 5, 1995, now Pat. No. 5,766,404, which is a continuation-in-part of application No. 08/350,320, filed on Dec. 5, 1994.

(51) Int. Cl.$^7$ ........................... H05H 1/00; H05H 21/00; H01L 21/00
(52) U.S. Cl. ................. 156/345; 118/723 R; 118/723 E; 118/729
(58) Field of Search .................. 118/719, 723 R, 118/723 MW, 723 MR, 723 MP, 723 ME, 723 E, 723 ER, 729, 715, 725, 733; 156/345 P, 345 PC, 345 WH, 345 MC, 345 MW, 345 ME; 204/298.25, 295.35

(56) References Cited

U.S. PATENT DOCUMENTS

| | | | |
|---|---|---|---|
| 4,208,159 | * 6/1980 | Uehara et al. | 414/225 |
| 4,252,595 | * 2/1981 | Yamamoto et al. | 156/345 |

(List continued on next page.)

*Primary Examiner*—Richard Bueker
(74) *Attorney, Agent, or Firm*—Wood, Herron & Evans, L.L.P.

(57) ABSTRACT

A plasma treatment system (10) is provided having an automated, in-line processing ability. The preferred embodiment is directed toward plasma treatment of PC boards (28) but is generally applicable to any substrate susceptible of plasma reaction. The plasma treatment system (10) has the primary components of a reaction chamber (14) and chamber base (16), a chamber lifting assembly (18), a conveyor input assembly (12), a push mechanism (20) and associated linear drive assembly (22), an output assembly (24), an electronic control system (26), and a vacuum and plasma generating system (27). Each of the conveyor input assembly (22), reaction chamber (14), and output assembly (24) include pairs of guide rails (34, 52, and 106, respectively) which are capable of being juxtaposably aligned relative to one another and upon which the PC boards (28) may guideably and sideably travel. The push mechanism 20 effectuates both movement and positioning of the PC boards (28) along the guide rails (34, 52, and 106). To allow placement of the PC boards (28) within the reaction chamber (14) and upon the chamber guide rails (52), the reaction chamber (14) is capable of vertical movement via the chamber lifting assembly (18), the reaction chamber (14) being open-bottomed and vacuum-tightly fittable upon the chamber base (16). Plasma treatment is initiated using conventional plasma generating elements. The push mechanism (20) and guide rail (34, 52, and 106) arrangement provide that multiple PC boards may be properly positioned for simultaneous processing in an in-line fashion. Applied DC biasing (502) is used to increase etch rates and plasma flow directionality. An alternative embodiment (410) incorporates a multi-level guide rail arrangement together with vertically raiseable input and output carriers (110 and 122) to provide that two or more levels of PC boards (28) may be simultaneously treated by plasma reaction. A third embodiment includes supplies for applying Radio Frequency (RF) power (504) and DC bias power (502) to the gas plasma. By using vertical electrodes (598), the plasma can be made to flow horizontally between the layers of a multilevel array or magazine (620) that holds parts that are to be treated.

24 Claims, 12 Drawing Sheets

U.S. PATENT DOCUMENTS

| | | | |
|---|---|---|---|
| 4,318,767 | * | 3/1982 | Hijikata et al. ...................... 156/345 |
| 4,405,435 | * | 9/1983 | Tateishi et al. ...................... 204/298 |
| 4,637,853 | * | 1/1987 | Bumble et al. ...................... 156/345 |
| 4,889,609 | * | 12/1989 | Cannelia .............................. 204/298 |
| 5,044,871 | * | 9/1991 | Davis et al. ......................... 414/786 |
| 5,303,671 | * | 4/1994 | Kondo et al. ........................ 118/719 |
| 5,573,597 | * | 11/1996 | Lantsman ...................... 118/723 MP |
| 5,587,205 | * | 12/1996 | Saito et al. ........................... 427/553 |
| 5,958,510 | * | 9/1999 | Sivaramakrishnam et al. .. 427/255.6 |

* cited by examiner

HIGH THROUGHPUT PLASMA TREATMENT SYSTEM

CROSS-REFERENCE TO RELATED APPLICATIONS

This application is a continuation-in-part of co-pending U.S. application Ser. No. 08/601,687, which was filed on Feb. 15, 1996 and is a continuation-in-part of application Ser. No. 08/567,797, filed Dec. 5, 1995, now U.S. Pat. No. 5,766,404, which is a continuation-in-part of application Ser. No. 08/350,320, filed Dec. 5, 1994.

TECHNICAL FIELD

The present invention relates generally to apparatus for plasma treatment, and more particularly to a plasma treatment system that offers an improved automated processing capability.

BACKGROUND ART

Gas plasma treatment of a variety of substrates, particularly those in the electronics field, is a well-established and proven process that increases surface activation (wettability), improves die attach, increases the reliability and strength of wire bonds, and provides better adhesion for encapsulation. Plasma systems have been in use for over 25 years for such applications and offer significant advantages over liquid chemical treatment methods and other dry methods such as ozone.

Disclosed in U.S. Pat. No. 4,208,159, issued to Uehara et al. on Jun. 17, 1980, is an apparatus that performs, in an automated assembly line manner, the plasma treatment of individual electronic parts, namely, semiconductor wafers. Prior to the invention of Uehara, plasma treatment of electronic parts was performed in batch-wise fashion. As Uehara describes, such simultaneous plasma treatment of a large number of parts generally does not result in an even reaction (i.e., etching or cleaning) at the surface of a substrate. Batch-wise treatment also reduces productivity by interrupting the flow of processing and assembly of parts.

Uehara provides for a reaction chamber having an open bottom portion and a wafer "table" that moves vertically up and down to be vacuum-sealable with the opening of the reaction chamber. The apparatus furlier includes an in-take carrier means for carrying a wafer to a position adjacent the wafer table, and an in-take pick-up means for picking up the wafer from the in-take carrier means and placing the wafer onto the wafer table. Disclosed in the patent are two combinations of such in-take carrier and pick-up means, one of which employs two revolving arms, each having a suction type pick-up, the other of which employs two linear traveling arms, each having a suction pick-up as well. After the single wafer has been placed on the wafer table, the wafer table is raised to seal against the reaction chamber and the plasma process is initiated. Out-take means identical to the in-take carrier and pick-up means are used for removal of the treated wafer from the wafer table after the wafer table has been disengaged and lowered from the reaction chamber opening.

The invention of Uehara offers substantial advantages in that it makes possible the in-line, hands-off plasma processing of individual parts (wafers). However, both of the embodiments disclosed are much more limiting in their scope of operation than is desirable. The invention does not allow, when it is desired, for the plasma treatment of more than one part at a time. It was noted previously that individual processing of parts is advantageous with respect to the evenness of the plasma reaction that may be obtained. However, it is also the case that a sufficiently uniform reaction may be obtained, depending on the nature of the parts (and upon appropriate spacing therebetween), where more than one part at a time is treated. Uehara does not address this issue. In addition, pick-up mechanisms of the type shown in Uehara, which as noted is in the form of a suction device, are known to be not entirely free from droppage and breakage of parts due to temporary loss or irregularity of vacuum pressure.

Shown in U.S. Pat. No. 4,318,767, issued to Hijikata et al. on Mar. 9, 1982, is another automatic in-line plasma system for treatment of semiconductor wafers. Hijikata employs a non-movable reaction chamber with a vertically movable wafer table contained therein. Shutter-like slits, which are vacuum-sealable and which are present at opposing ends of the reaction chamber, provide entry and exit portals for the wafers. The wafers are introduced into the reaction chamber with a pair of slidable parallel arms spaceably distanced so as to support a wafer therebetween. In the process sequence, a single wafer is loaded onto the ends of the arms via a conveyor belt apparatus. The arms then slide forward to extend into the reaction chamber through the entry portal such that the wafer is positioned over the wafer table. The wafer table moves upward to a height just above the arms, lifting the wafer off of the arms in the process. After the arms have been retracted, the entry slit is sealed, the chamber evacuated, and the plasma process initiated to treat the wafer lying on the table. The wafer is removed by extension through the exit portal of a pair of arms identical to the ones previously employed followed by a lowering of the wafer table, which causes the treated wafer to rest upon the arms. Retraction of the arms then removes the wafer from the chamber.

Hijikata eliminates the precarious suction pick-up arrangement of Uehara, but again fails to offer an option for treating more than one part at a time in an in-line fashion. Nor is the invention of Hijikata amenable to such, since even were more than one part crudely loaded onto the ends of the sliding arms of the apparatus, no mechanism is available for properly spacing the parts upon the wafer table, such spacing being critical when more than one part is subjected to plasma treatment.

U.S. Pat. No. 4,889,609 to Cannella discloses an automated dry etching system which is titled "Continuous" but utilizes input and output belts which are enclosed in pressurized chambers which are maintained at a preselected partial vacuum. The enclosed nature of these chambers necessarily limit the number of parts that can be treated before the chambers have to be opened for loading a new batch to be processed. Additionally, the configuration of the input gate allows a very limited number of parts to be treated at once, and consequentially, the throughput of this system can be expected to be likewise limited.

U.S. Pat. No. 4,252,595 to Yamamoto et al. illustrates a plasma etching apparatus which includes a rotatable disk in the etching chamber, or alternately, a conveyer assembly, which is also included within the plasma chamber. Both of these variations can be expected to have problems related to the use of moving parts within the plasma chamber. Moving parts typically require lubricants, which can, over time, contaminate the etching chamber and the treated parts. Especially in near vacuum conditions, out-gasing of lubricants can be expected, and effects of even minute amounts of contaminants can be cumulative over time. Additionally, when moving parts are exposed to conditions such as in a plasma etching chamber, these parts are susceptible to corrosion. Moving parts which operate on fine tolerances can be expected to require frequent replacement when exposed to such harsh operating conditions.

U.S. Pat. No. 5,587,205 to Saito et al. also shows a plasma processing method including an electrode stage on a liffing mechanism. These moving parts can be expected to experience the same difficulties of contamination and corrosion discussed above. Additionally, the throughput of the system would appear to be very limited.

U.S. Pat. No. 4,405,435 to Tateishi et al. discloses a plasma treatment apparatus, but there is an elevator in the etching chamber, thus introducing moving parts. Once again, these moving parts can be expected to experience the same difficulties of contamination and corrosion discussed above.

Because of the limitations associated with most presently available plasma treatment systems, a substantial need still exists for such a system as offers improved processing capability while also providing for the simultaneous treatment of a plurality of parts.

DISCLOSURE OF THE INVENTION

Accordingly, it is an object of the present invention to provide a plasma treatment system that provides an automated, processing capability of electronic and other parts.

It is another object of the invention to provide a plasma treatment system capable of treating a plurality of parts at once.

It is a further object to provide a plasma treatment system that provides precise spacing for the treatment of a plurality of parts.

It is yet another object to provide a plasma treatment system that utilizes guide rails together with a distinct push mechanism for conveyance of the parts to be treated.

It is yet a further object to provide a plasma treatment system that employs infrared sensing devices to aid in the detection and positioning of the parts to be treated.

It is still another object to provide a plasma treatment system wherein no moving parts of the system are present within the reaction chamber during the treatment process.

It is a still further object to provide a plasma treatment system whereby parts may be treated on multiple levels within the reaction chamber.

It is a yet another object of the present invention to provide a DC bias to the electrodes in order to promote better penetration of plasma between parts.

It is still another object of the present invention to increase ionization rates, and increase the energy of the ions and electrons to thus increase etch rates and decrease processing time.

It is a still further object of the present invention to provide more directional etching, resulting in more anisotropic etching, by using a DC bias.

It is an additional object of the present invention to provide a plasma treatment system which utilizes vertically oriented electrodes to provide better uniformity of treatment of parts.

Briefly, the preferred embodiment of the present invention is a plasma treatment system having an automated processing ability. The preferred embodiment is directed toward plasma treatment of PC boards but is generally applicable to any substrate susceptible of plasma reaction. For the purposes of discussion, the typical object substrate is referred to as a PC board, although it is recognized that it could well be a wafer or other object. The plasma treatment system has the primary components of a reaction chamber and chamber base, a chamber lifting assembly, a conveyor input assembly, a push mechanism and associated linear drive assembly, an output assembly, an electronic control system, and vacuum and plasma generating systems.

The conveyor input assembly includes a conveyor which rides upon a conveyor position actuator. A PC board is loaded onto the conveyor from, for example, a preceding belt-type conveyor in an overall assembly line process. The reaction chamber is lifted vertically via the chamber lifting assembly, and the conveyor is moved by the conveyor position actuator to be in aligned juxtaposition with the load end of a pair of chamber guide rails which are present within the perimeter of the chamber base and which are further supported atop a reaction-inducing electrode. The push mechanism moves the PC board from the conveyor and onto the chamber guide rails. The conveyor is then moved back to the starting position so that another PC board may be conveyed and carried by the conveyor. The second PC board is also transferred onto the chamber guide rails by the push mechanism.

The push mechanism employs first and second catch actuators that lower and raise first and second catch fingers. The first and second catch fingers extend into the travel area of the PC boards and, in the lowered position, are able to abuttably engage the PC boards and move them to any desired location along the conveyor or chamber guide rails. The catch fingers are raised when it is desired that the push mechanism pass unhindered above the travel area of the PC boards. First and second catch sensors located on the push mechanism, together with similar sensors located on the linear drive assembly, provide infrared detection so that the push mechanism may locate the PC boards and also properly space the PC boards upon the chamber guide rails for a uniform plasma reaction.

After multiple PC boards have been loaded onto the chamber guide rails, the reaction chamber is lowered upon the chamber base, whereon it is vacuum-tightly fittable, and plasma treatment is initiated using conventional plasma generating elements. When treatment is complete, the reaction chamber is raised, and an output carrier is moved into juxtaposition with an unload end of the chamber guide rails and the push mechanism is caused to unload the PC boards in an analogous fashion to the loading process.

A DC bias circuit can be included in the plasma treatment system to increase the directionality of plasma flow and the energy level of the ions and electrons in the plasma. The higher energy level also increases the ionization rate, thus increasing the number of ions and electrons. The increased energy level and increased ionization rate both act to produce a higher etching rate and thus a shorter processing time. The increased bias also results in a more directional flow of ions onto the parts, resulting in a more anisotropic etching which is required when etching vias and holes.

An alternative embodiment incorporates a multi-level arrangement to provide that two or more levels of PC boards may be simultaneously treated by plasma reaction. In the alternative embodiment, the PC boards are moved by a push mechanism similar to that employed in the single level embodiment, but having additional catch fingers capable of being positioned at heights as correspond to the distance between an upper and lower pair of chamber guide rails arranged in bi-level array upon the chamber base. A first PC board is initially transferred by the push mechanism from a stationary conveyor and onto the upper level of an input carrier also having a bi-level array of input guide rails spaceably distanced identically to the chamber guide rails. A first vertical position actuator raises the input carrier to bring the lower level of the input carrier into alignment with the level of the stationary conveyor so that a second PC board may then be moved onto the input carrier by the push mechanism.

The input carrier, carrying the two PC boards, is moved by a first horizontal position actuator to be near the chamber guide rails. The push mechanism then simultaneously transfers both PC boards onto the upper and lower chamber guide rails. The input carrier then moves back to be adjacent to the stationary conveyor and two additional PC boards are reloaded as before. The additional PC boards are also transferred onto the chamber guide rails by the push mechanism, and the reaction chamber is lowered and the plasma process is begun as for the single-level embodiment. An output carrier identical to the input carrier is employed to remove the PC boards after treatment is complete. As in the first embodiment, a DC bias circuit can be included in the plasma treatment system to increase the directionality of plasma flow. When this DC bias is applied to vertical electrodes, a horizontal flow is established that improves penetration in the clearance spaces between parts which have been placed in multilevel arrays. This improved penetration allows closer spacing of layers, while still maintaining good uniformity of treatment. Thus, throughput of parts can be increased.

A third preferred embodiment is a plasma treatment system for treating parts, which includes a reaction chamber, a device for supporting a number of parts in a multilevel array and a mechanism for generating a gas plasma and inducing a plasma reaction with the parts. The gas plasma mechanism including devices for applying Radio Frequency (RF) power and DC bias power to the gas plasma. This is done by providing one or more electrodes through which RF is used to excite the gas to a plasma state, and the DC bias is also applied to one or more elecrodes. This DC bias is used to direct the flow of the plasma, increase the ionic energy, and increase the ionization rate. By using vertically oriented electrodes, the plasma can be made to flow horizontally between the layers of a multilevel array that holds parts that are to be treated. The applied DC bias causes a more defined directionality of flow, which allows better penetration of the plasma to the multilevel array, and creates more uniformity of treatment. This improved penetration also allows closer spacing of parts and levels in a carrier, so that a carrier may have numerous levels configured into a "cassette" or "magazine". Use of magazines which carry a large number of parts allow increased throughput of parts, in either in-line, batch-processing or systems which use robotics.

An advantage of the present invention is that a plurality of parts may be subjected to plasma treatment simultaneously in an in-line fashion, thereby speeding up processing time.

Another advantage of the invention is that none of the moving parts of the system are subjected to degradation from plasma reaction.

A further advantage is that the system is entirely automated, thereby providing hands-free operation.

Yet another advantage of the invention is that parts may be loaded within the reaction chamber on multiple levels, thereby multiplicatively increasing the throughput of parts.

An additional advantage of the invention is that vertically oriented electrodes permit better flow of the plasma over parts which are horizontally placed, and thus more uniformity of treatment of the parts is achieved.

Another advantage of the present invention is that by using an increased DC bias, there is better penetration of the plasma between parts in multilevel arrays.

Yet another advantage of the present invention is that improved penetration allows closer spacing of levels of parts in a multilevel array, thus allowing more levels to be placed in a given vertical space.

A still further advantage of the present invention is that by using an increased DC bias, higher energy ions and electrons are produced, and ionization rates are increased, both of which act to increase etching or cleaning rates.

A yet further advantage of the present invention is that throughput capabilities of the treatment system is increased, and processing time is reduced for systems which use in-line processing, for those which use batch-processing and for those which use robotics to handle materials.

These and other objects and advantages of the present invention will become clear to those skilled in the art in view of the description of the best presently known mode of carrying out the invention as described herein and as illustrated in the several figures of the drawings.

BEST MODE FOR CARRYING OUT THE INVENTION

Figure 1:
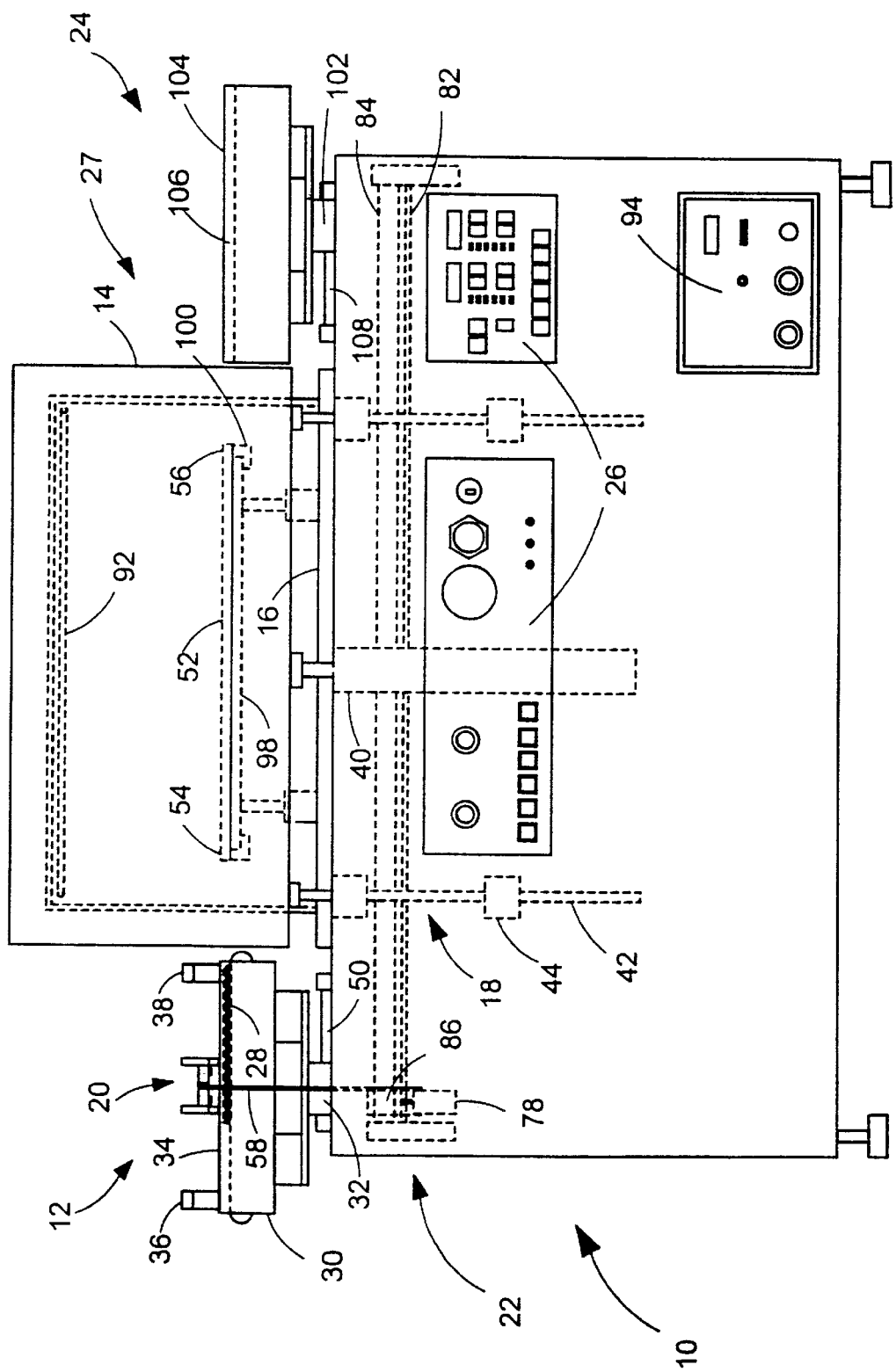
FIG. 1 is a front view showing the single-level embodiment of the present invention (for clarity, in the drawing figures the PC boards are shown as not being hidden by the guide rails)

The preferred embodiment of the presenet invention is a plasma treatment system for increased throughput plasma treatment and cleaning of any of a variety of parts and components. The present invention can be used to increase efficiency and cut processing time in a number of different configurations, including in-line processing, batch processing, and processing which use robotics for material handling. The plasma treatment system of the preferred embodiment, although generally applicable to any substrate susceptible of plasma reaction, is directed toward use within the electronics industry, and more particularly toward assembly and packaging applications associated therewith, and is set forth in FIG. 1, where it is designated therein by the general reference character 10.

Referring to the front view of FIG. 1 of the drawings, the plasma treatment system 10 is shown to include the primary components of a conveyor input assembly 12, a reaction chamber 14 and chamber base 16, a chamber lifting assembly 18, a push mechanism 20 and associated linear drive assembly 22, an output assembly 24, an electronic control system 26, and a vacuum and plasma generating system 27. In the particular preferred embodiment 10 shown, printed circuit boards (PC boards) 28 are the electronic parts that are to undergo plasma reaction treatment, although it is to be understood that many other varieties of substrate objects may be substituted.

Figure 2:
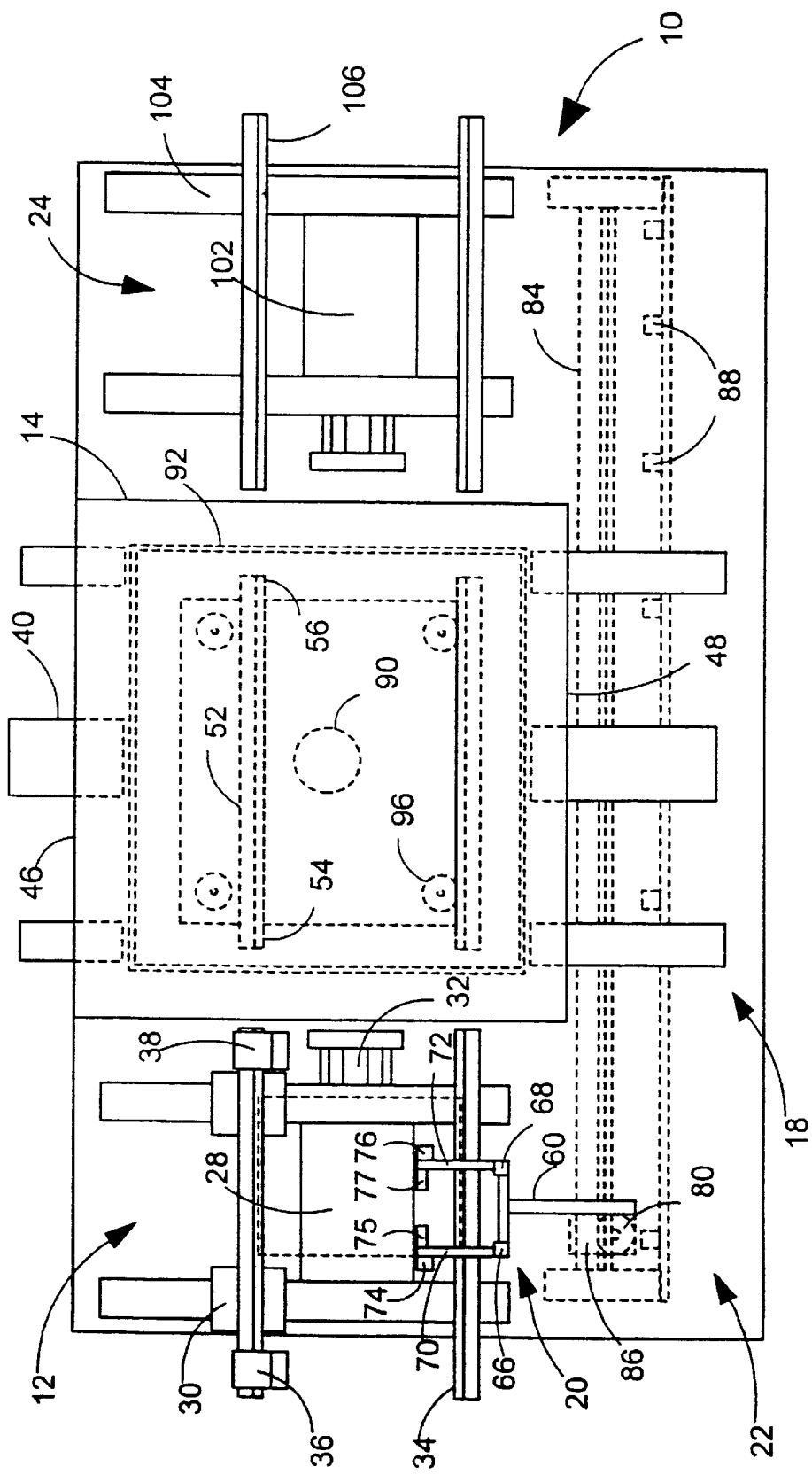
FIG. 2 is a top plan view of the embodiment of FIG. 1.

Referring now to both FIG. 1 and to the top plan view of FIG. 2, the conveyor input assembly 12 utilizes a number of different positioning and movement elements to assist in the transport of the PC boards 28 to the reaction chamber 14. Among these elements are a conveyor 30 and a conveyor position actuator 32, upon which the conveyor 30 is mounted. The conveyor 30 receives a PC board 28, possibly from a previous conveyor (not shown), as in a typical inline assembly operation, or from a "cassette"(also not shown) which may contain a number of PC boards 28, and then moves the PC board 28 horizontally in conveyor-belt fashion to a position farther along the conveyor 30 and closer to the reaction chamber 14. The conveyor 30 may be of a conventional belt, wire or roller type. A pair of conveyor guide rails 34 provide alignment for the PC boards 28 during the conveyance. In addition, the conveyor guide rails 34 are adjustable so that PC boards 28 of different widths may be transported.

Positional information as to the location of the PC board 28 upon the conveyor 30 is provided by first and second conveyor sensors 36 and 38. The first and second conveyor sensors (36 and 38) are of the infrared variety and are located at each end of the conveyor 30. Thus, the initial appearance of a PC board 28 upon the conveyor 30 is detected by the first conveyor sensor 36, which signals an activation of the conveyor 30 to begin carrying the PC board 28 forward until the PC board 28 is detected by the second conveyor sensor 38. Upon this latter detection, movement along the conveyor 30 ceases and the PC board 28 waits to be transferred within the reaction chamber 14. Still referring to FIGS. 1 and 2, the chamber lifting assembly 18 includes two chamber lift actuators 40 and four chamber guide rods 42, the latter being associated with a number of pillow blocks 44. The chamber lift actuators 40, which are of a conventional pneumatic nature and are commercially available, are supportingly located beneath a first side wall 46 and a second side wall 48 of the generally box-shaped and open-bottomed reaction chamber 14. The chamber lifting assembly 18 provides for a vertical lifting of the entire reaction chamber 14 off of and above the chamber base 16 in order that the PC board 28 may be transferred within the reaction chamber 14. The chamber guide rods 42, which are symmetrically located near the four corners of the reaction chamber 14, stabilize the reaction chamber 14 as it is being lifted. The chamber guide rods 42 are snugly slidable within the pillow blocks 44 and thereby maintain a strict vertical movement of the reaction chamber 14. It is apparent that chamber lift actuators 40 of a variety other than pneumatic in operation might be employed and, moreover, that a variety of lifting or displacement mechanisms might be suitably employed to lift the reaction chamber 14. It is therefore not intended that the invention 10 be limited to the particular lifting assembly 18 shown.

Figure 3A:
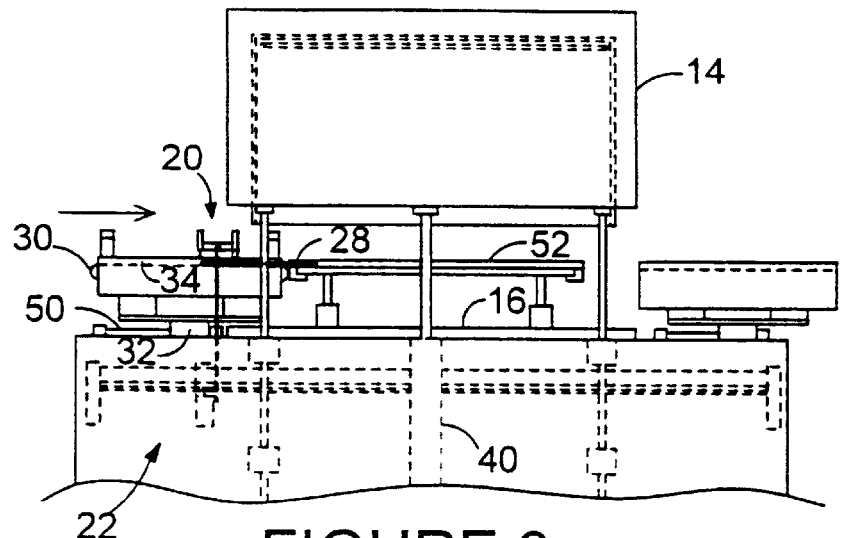
FIGS. 3a–c are explanatory partial front views of the embodiment of FIG. 1 showing processing of the PC boards.

Referring now to FIG. 3a, upon activation of the chamber lift actuators 40, the reaction chamber 14 is lifted to a height such that the conveyor 30 has suitable clearance for horizontal movement beneath the reaction chamber 14. This horizontal movement is provided by the conveyor position actuator 32. The conveyor position actuator 32 is a commercially available component of the so-called "rodless air cylinder" variety and travels along an associated position actuator guide 50. The position actuator guide 50 is oriented in the direction of the reaction chamber 14 and is of a length such that when movement of the conveyor position actuator 32 has stopped at the end thereof, the conveyor 30 (and thus the PC board 28 carried thereon) is caused to be extended into the area of the chamber base 16. A pair of chamber guide rails 52 are adjustable similarly to the conveyor guide rails 34 and are set to the same dimensions and height as the conveyor guide rails 34. Thus, once the conveyor 30 has been transported the length of the position actuator guide 50, the conveyor guide rails 34 are caused to be juxtaposedly aligned with the chamber guide rails 52. Upon such juxtaposition, the push mechanism 20 is employed to move the PC board 28 onto a load end 54 of the chamber guide rails 52 and then farther along the chamber guide rails 52 to a predetermined position thereon. (The two ends of the chamber guide rails 52 have been denoted within the drawings as a load end 54 and an unload end 56, in accordance with the direction of flow of parts through the plasma treatment system.)

It is apparent that the conveyor guide rails 34 and chamber guide rails 52 might take many forms. While in the preferred embodiment the guide rails (34 and 52) have an appearance not unlike the rails of a railroad track (albeit a miniature version thereof) such is not necessary. Indeed, it is possible to employ but a single guide rail upon which parts may be transported when held by a suitable holder adapted to travel upon such a solitary guide rail. The chamber guide rails 52, especially, might also be more in the form of a shelf. Such a shelf could be either heated (e.g., with a heating element on the underside) or cooled (e.g., where the shelf is hollow, or has cavities, and a chilled liquid is circulated therethrough) as desired to enhance processing.

The versatility and capabilities of the push mechanism 20 (and the associated linear drive assembly 22) are of key importance to the advantages offered by the plasma treatment system 10 and the efficiency obtained thereby. As shown in the close-up view of FIG. 4, and in the end view of FIG. 5, the push mechanism 20 includes a vertically disposed drive attachment portion 58, a horizontally disposed, T-shaped arm member 60, which is joined to the top of the drive attachment portion 58 at the base of the "T", and first and second catch assemblies 62 and 64. The first and second catch assemblies (62 and 64) are located at each end of the cross portion of the "T" of the arm member 60 and include first and second catch actuators 66 and 68, respectively. The first and second catch actuators (66 and 68) act to lower and raise attached first and second catch fingers 70 and 72, which are horizontally disposed members having lengths that permit extension over the travel area of the PC board 28. The catch actuators (66 and 68) are commercially available pneumatic devices having air cylinders and spring returns. First and second catch blocks 74 and 76, present at the ends of the first and second catch fingers (70 and 72), respectively, and depending therefrom, permit abuttable engagement of the PC board 28 when the catch fingers (70 or 72) are in a lowered position. A first and second catch sensor 75 and 77, which are of the infrared variety, are also located at the ends of the first and second catch fingers (70 or 72), respectively, and provide for detection of the PC boards 28. It will be apparent that a variety of configurations for the dispositions and shapes of the components as comprise the push mechanism 20 may be employed to achieve the "catching" and "pushing" ability of the push mechanism 20 (the operation of which will be described in more detail later herein). For example, the catch actuators (66 and 68) might be relocated from the arm member 60 to the ends of the catch fingers (70 and 72), with the catch fingers (70 and 72) then attached directly to the arm member 60 and the catch blocks (74 and 76) attached directly to the catch actuators (66 and 68), such that only the catch blocks (74 and 76) are raised and lowered, among many other possible configurations. The push mechanism 20 might also take the form of a "pull" "mechanism" where parts are processed which accommodate this or are held in a holder adapted to permit such. Therefore, the description of the push mechanism 20 as applies to the invention 10 is not intended to be limited to just the particular arrangement as has been set forth.

Figure 4:
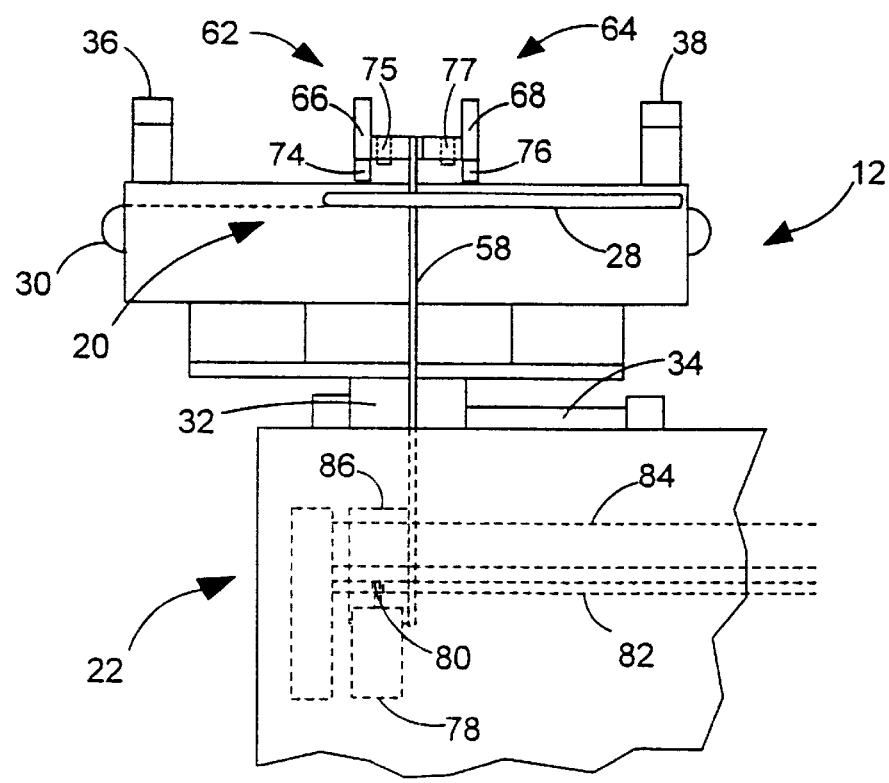
FIG. 4 is a partial front view of the embodiment of FIG. 1 showing the push mechanism of the single-level embodiment in close-up detail.
Figure 5:
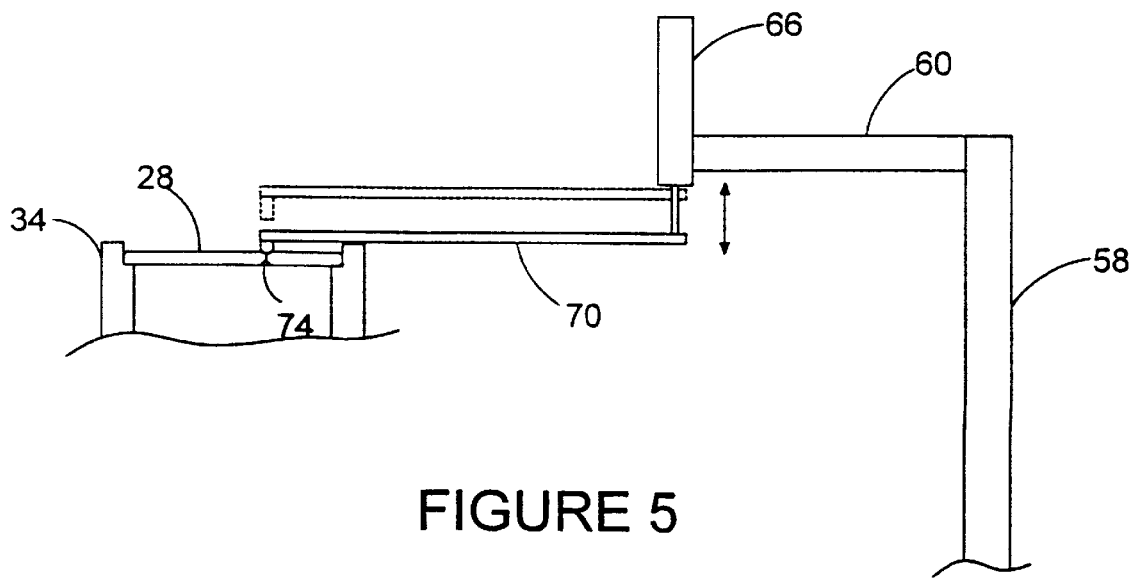
FIG. 5 is an end view of the push mechanism of the single-level embodiment.

Continuing to refer to FIG. 4, the linear drive assembly 22 includes the primary components of an A.C. motor 78 and associated drive gear 80, a drive rack 82, and a guide rack 84 and guide bearing 86. The linear drive assembly 22 provides for linear travel of the push mechanism 20 along most of the length of the plasma treatment system 10 in a relation parallel to the first conveyor and chamber guide rails (34 and 52). Travel impetus and "pushing" ability for the push mechanism 20 is accorded by the A.C. motor 78, which has a variable speed capability and is reversible. The A.C. motor 78 is engageably mounted to the drive rack 82 via the drive gear 80, while the drive attachment portion 58 of the push mechanism is slidably mounted on the guide rack 84 via the guide bearing 86, which maintains the drive attachment portion 58 in a vertical orientation during travel. It will be understood that the precise nature of the linear drive assembly 22 is not of critical importance to the invention 10 herein and that drives of other designs, and which utilize various other components, may perform a substantially similar movement function (e.g., a ball screw drive and/or a belt and pulley arrangement, etc.). The linear drive assembly 22 is also provided with a plurality of drive sensors 88 (see FIG. 2) which provide information as to the positional status of the push mechanism 20 at any given moment as the push mechanism 20 moves along the lengths of the drive and guide racks (82 and 84). Referring back now to FIGS. 2 and 3*a*, as noted previously, the lengths of the first and second catch fingers (70 and 72) are such as to extend over the travel area of the PC board 28. The first catch sensor 75 functions to locate the PC board 28. Once the PC board 28 has been located, the first catch actuator 66 causes the first catch block 74 to be downwardly extended to a position behind the PC board 28 and to be in abuttable proximity thereto. Upon activation of the linear drive assembly 22, the push mechanism 20, by way of the abutting first catch block 74, moves ("pushes") the PC board 28 to the desired location along the chamber guide rails 52 and to a predetermined location fully within the perimeter of the chamber base 16.

Importantly, the push mechanism 20, in conjunction with chamber guide rails 52 of appropriate length, provides that a multiplicity of PC boards 28 (or other parts), depending on their size, may be loaded into the reaction chamber 14 for simultaneous plasma treatment. The push mechanism 20 and associated infrared catch sensors (75, 77, and 88) provide that the parts are correctly spaced (via programmed instructions through the electronic control system 26; see below) for a uniform plasma treatment. Thus, and referring now to FIGS. 3 and 6, after having positioned the first PC board 28 near the unload end 56 of the chamber guide rails 52, a second PC board 28' may be transferred onto the chamber guide rails 52 to be located spaceably near the first PC board 28 according to the sequence of operations set forth above (with an additional step being that after the first PC board 28 has been loaded, the first catch finger and block (70 and 74) are retracted by the first catch actuator 66 so that the push mechanism 20 may then have sufficient clearance to pass back over the trailing second PC board 28' in order that the second PC board 28' may then be "caught" and moved forward in similar fashion to the first PC board 28). This ability to treat by plasma teaction, in an in-line fashion, multiple PC boards 28 (or other parts) at once, while simultaneously providing that no moving components of the plasma treatment system 10 are present within the reaction chamber 14 during the treatment, offers a distinct and great advantage over any prior art known to the inventors.

Figure 3B:
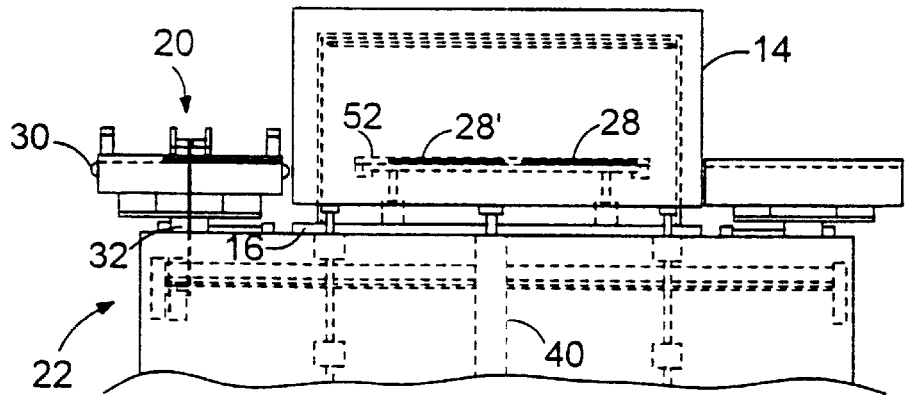
Figure 3C:
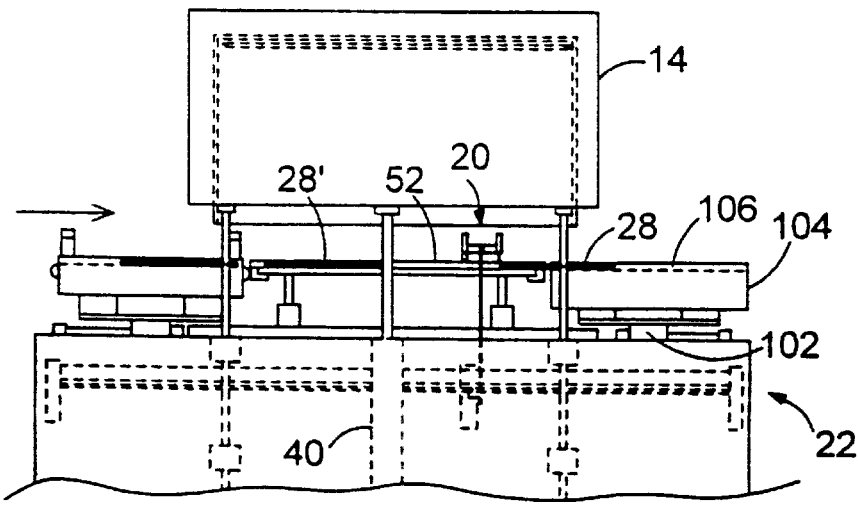

As is shown in FIG. 3*b*, after the last PC board 28' has been loaded, the first catch finger 70 is raised and the push mechanism 20 is moved by the linear drive assembly 22 to a location outside of the perimeter of the chamber base 16. At the same time, the conveyor position actuator 32 moves the conveyor 30 back out of the reaction chamber 14 area as well. The reaction chamber 14 is then lowered by the chamber lift actuators 40 onto the chamber base 16, whereon the reaction chamber 14 is vacuum-tightly fittable, and the plasma process is initiated. Referring again to FIG. 2, there is shown a vacuum and plasma generating system 27 having a number of elements of generally conventional nature. A vacuum port 90, to which is connected a vacuum pump (not shown), provides that the reaction chamber 14 may be evacuated to a predetermined level, which is generally in the so-called "soft vacuum" region of 0.1–1.0 mm Hg. A gas distribution manifold 92 allows for the continuous introduction of process gas (e.g., oxygen and argon) within the reaction chamber 14. Flexible Teflon® tubing (not shown) provides that the gas manifold 92 may be raised in conjunction with the reaction chamber 14. A plasma is generated within the evacuated reaction chamber 14 with a radio frequency generator 94, there being provided for this purpose four radio frequency feedthroughes 96 which are located in the chamber base 16. An electrode 98 for the application of high voltage, to which the chamber guide rails 52 are clamped with guide rail clamps 100 (see FIG. 1) and conveniently supported thereby, provides that plasma reaction may then occur at the surface of the PC boards 28. It will be apparent to those with ordinary skill in the art that other electrical and radio frequency configurations for the chamber guide rails 52 might be employed. Thus, the chamber guide rails 52 might be radio frequency powered, or grounded, or electrically "floating" (isolated), or some combination of the foregoing. Additionally, a DC bias circuit can be included in the plasma treatment system to increase the directionality of plasma flow and the energy level of the ions and electrons in the plasma. The higher energy level also increases the ionization rate, thus increasing the number of ions and electrons. The increased energy level and increased ionization rate both act to produce a higher etching rate and thus a shorter processing time. The increased bias also results in a more directional flow of ions onto the parts, resulting in a more anisotropic etching which is required when etching holes and vias. Anisotropic etching provides straight wall etching which decreases undercutting. This DC bias circuit is discussed in more detail below (see FIG. 12).

To reiterate, since the plasma treatment system 10 incorporates a method of transfer that provides that no moving parts are located within the reaction chamber is 14 during plasma treatment, no moving parts are degraded, and no contaminants (from machine oils or lubricants) are introduced onto the treated PC boards 28. When the plasma treatment is completed, nitrogen is introduced into the reaction chamber 14 to bring the pressure of the reaction chamber 14 up to atmospheric level, and the reaction chamber 14 is again lifted up and out of the way via the chamber lift actuators 40. Referring again to FIGS. 1 and 2, and also to FIG. 3c, the output assembly 24 is comprised of components essential identical to the conveyor input assembly 12, but without a conveyor-belt type capability, and provides an analogously reverse function thereto. Thus, a position actuator 102 moves an output carrier 104, which is mounted thereon, into close proximity to the unload and 56 of the chamber guide rails 52. The second catch sensor 77 present on the push mechanism 20 locates the first PC board 28, whereupon the second catch actuator 68 lowers the second catch finger and block (72 and 76) in order that the first PC board 28 may be pushed along the chamber guide rails 52 and unloaded onto an adjustable pair of output carrier guide rails 106. The output carrier 104 is then moved by the position actuator 102 (along an associated position actuator guide 108 as before) away from the reaction chamber 14 so that transfer of the PC board 28 (by the push mechanism 20) to the next station may occur. The remaining PC board(s) 28' is moved onto the output carrier 104 by the push mechanism 20 in similar fashion. Prior to the re-lowering of the reaction chamber 14, and while the unloading of the treated PC boards 28 is occurring, untreated PC boards 28 are again loaded into the reaction chamber 14 for plasma treatment following the steps outlined above. In addition to the aforementioned advantages, the plasma treatment system 10 of the present invention provides that parts may be treated by plasma reaction without ever having to remove them from the assembly line, thereby reducing overall process time.

As shown in FIG. 1, the flowthrough of parts through the plasma treatment system 10 is controlled by the electronic control system 26, which controls the conveyor input and output assemblies (12 and 24), the push mechanism 20 and associated linear drive assembly 22, and the chamber lifting assembly 18. The electronic control system 26 incorporates a microprocessor (not shown) and employs standard SMEMA communication.

Figure 6:
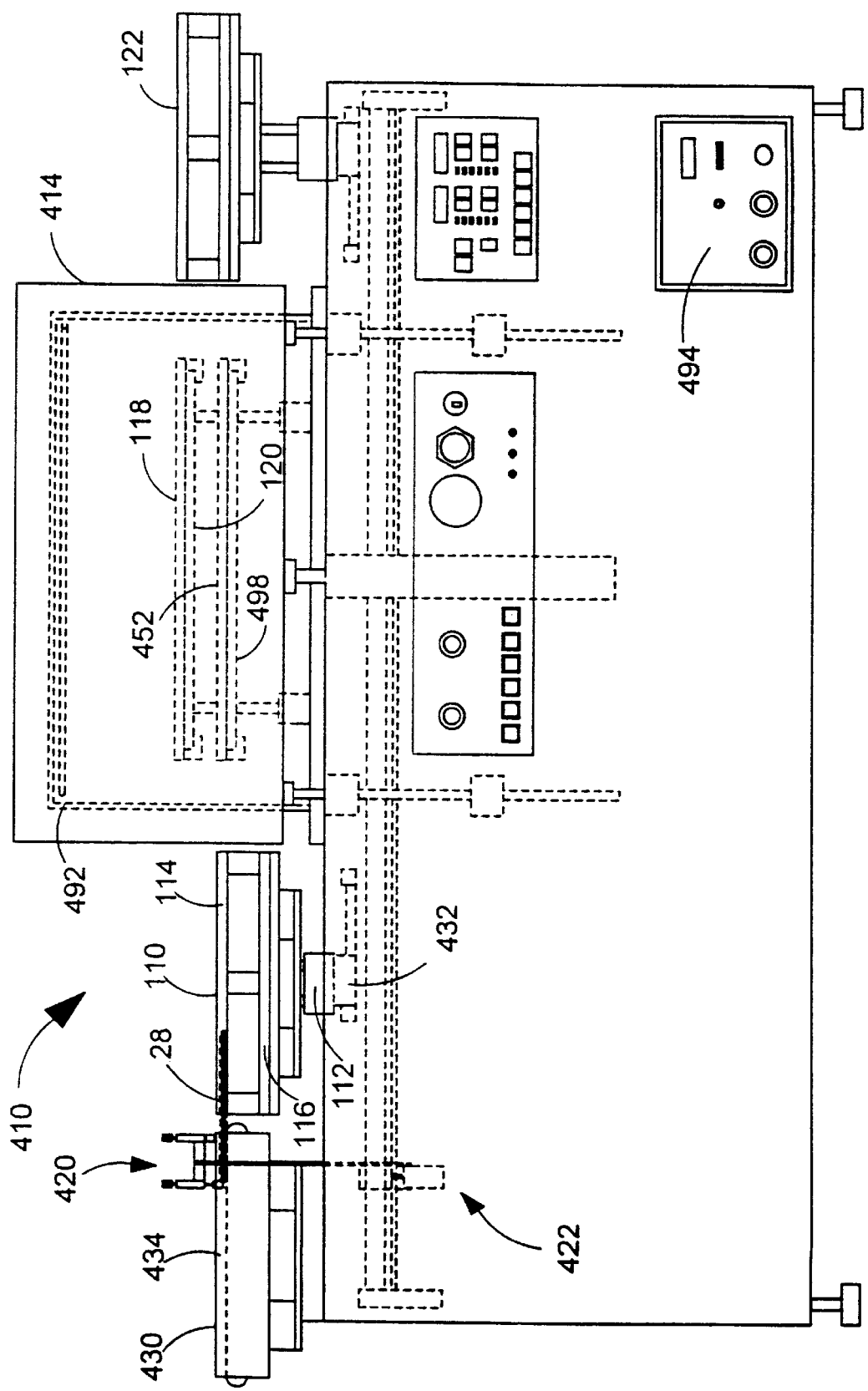
FIG. 6 is a front view showing the multi-level embodiment of the present invention.
Figure 7:
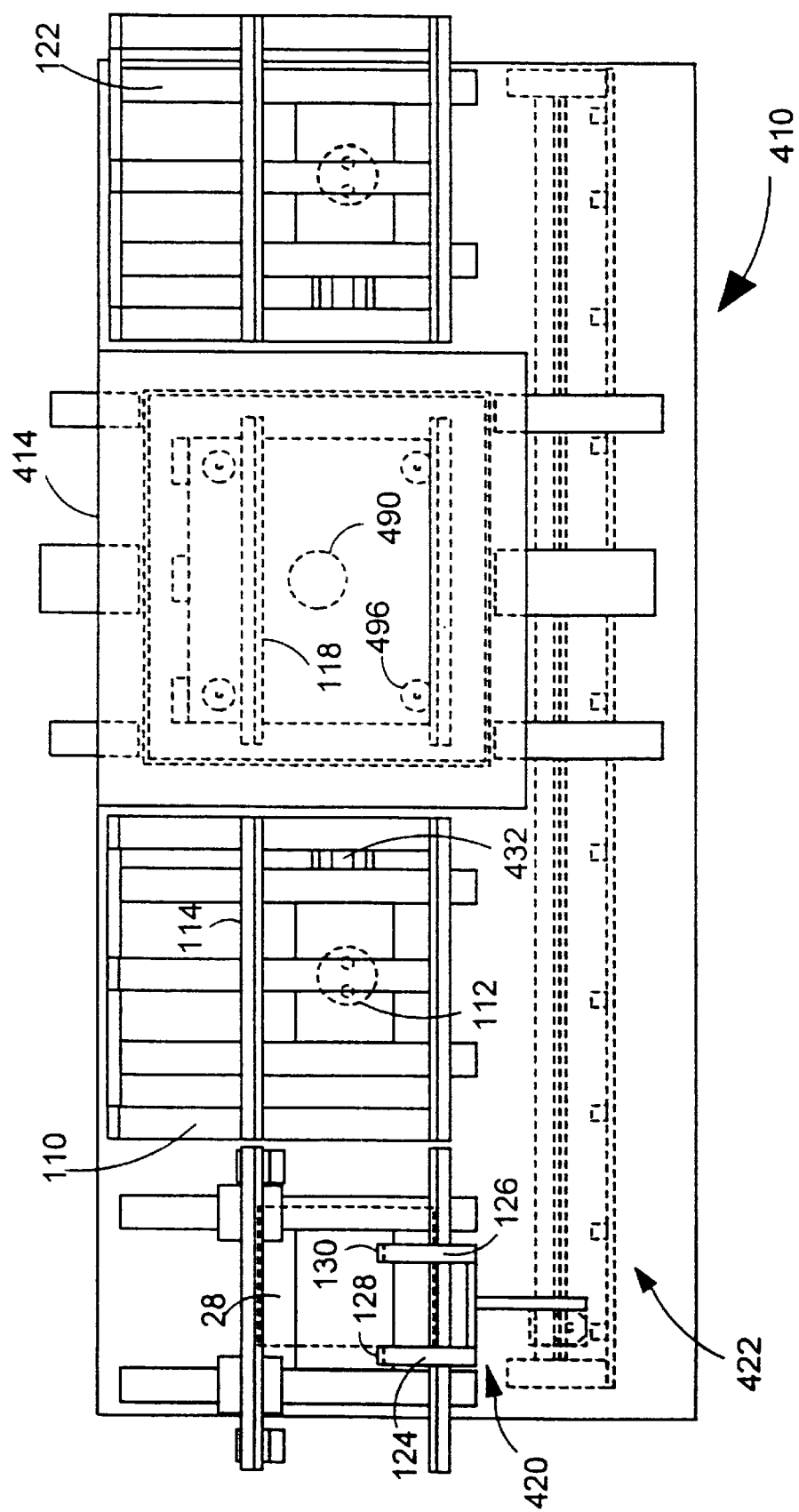
FIG. 7 is a top plan view of the embodiment of FIG. 6.

Shown in the front view of FIG. 6 is an alternative embodiment of the present invention, in which there is provided a means by which an even greater number of PC boards or other parts may be subjected to simultaneous plasma treatment. The alternative embodiment employs components very similar to the aforementioned embodiment, but so modified as to achieve a multi-level loading of PC boards within the reaction chamber and thereby making possible a multiplicatively increased throughput of PC boards or other parts. The alternative embodiment is designated as 410 in the drawings, and to the extent those elements of the alternative embodiment 410 are substantially identical (or closely correlate) to those previously appearing in the single-level embodiment 10, they will be referred to by a reference number incorporating the original reference number prefaced with the digit "4". New elements which appear will be numbered in continuous fashion from previously numbered elements of the single-level embodiment 10, beginning with the number "110". Referring now to both FIG. 6 and the top plan view of FIG. 7, a stationary conveyor 430 is essentially identical to the conveyor 30 of the single-level embodiment 10, having a pair of adjustable conveyor guide rails 434 for receiving a PC board 28 from, e.g., a previous conveyor (not shown), but does not move upon a conveyor position actuator (32). An input carrier 110 does move along a first horizontal position actuator 432 in similar fashion to the previous conveyor and output carrier (30 and 104) and, in addition, is provided with a first vertical position actuator 112 and two pairs of adjustable upper and lower input guide rails 114 and 116 in arrayed in bi-level fashion. The first vertical position actuator 112 acts to raise and lower the input carrier 110 such that when the input carrier 110 is in the lowered position the upper input guide rails 114 thereon are in co-planar and co-linear alignment with the conveyor guide rails 434. Alternatively, when the input carrier 110 is in the raised position, the lower input guide rails 116 are made to be in alignment with the conveyor guide rails 434. The vertical position actuator 112 is a commercially available pneumatic device, as before.

A reaction chamber 414 is vertically raiseable as before, and is associated with all of the relevant plasma-generating elements of the single-level embodiment 10 (including a vacuum port 490, a gas distribution manifold 492, a radio frequency generator 494, and four radio frequency feedthroughes 496), but now contains therein two pairs of adjustable upper and lower chamber guide rails 118 and 452 mounted in bi-level array upon upper and lower electrodes 120 and 498. The upper and lower chamber guide rails (118 and 452) are spaceably separated by a distance identical to the distance between the upper and lower input guide rails (114 and 116) of the input carrier 110. An output carrier 122 is identical to the input carrier 110.

Figure 8:
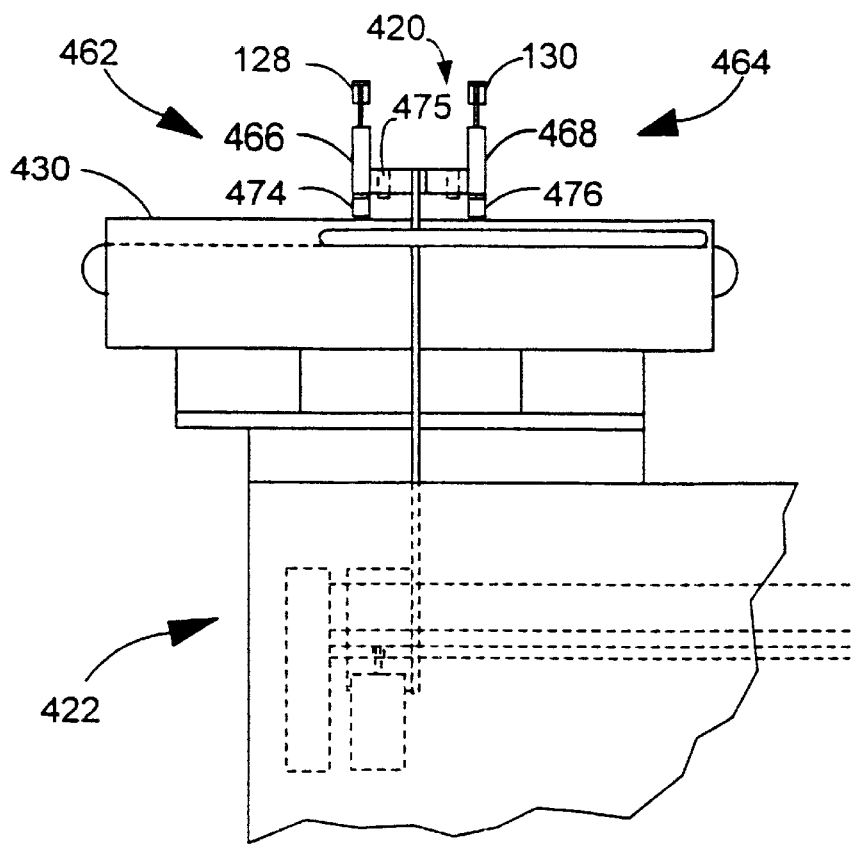
FIG. 8 is a partial front view of the embodiment of FIG. 6 showing the push mechanism of the multi-level embodiment in close-up detail.
Figure 10:
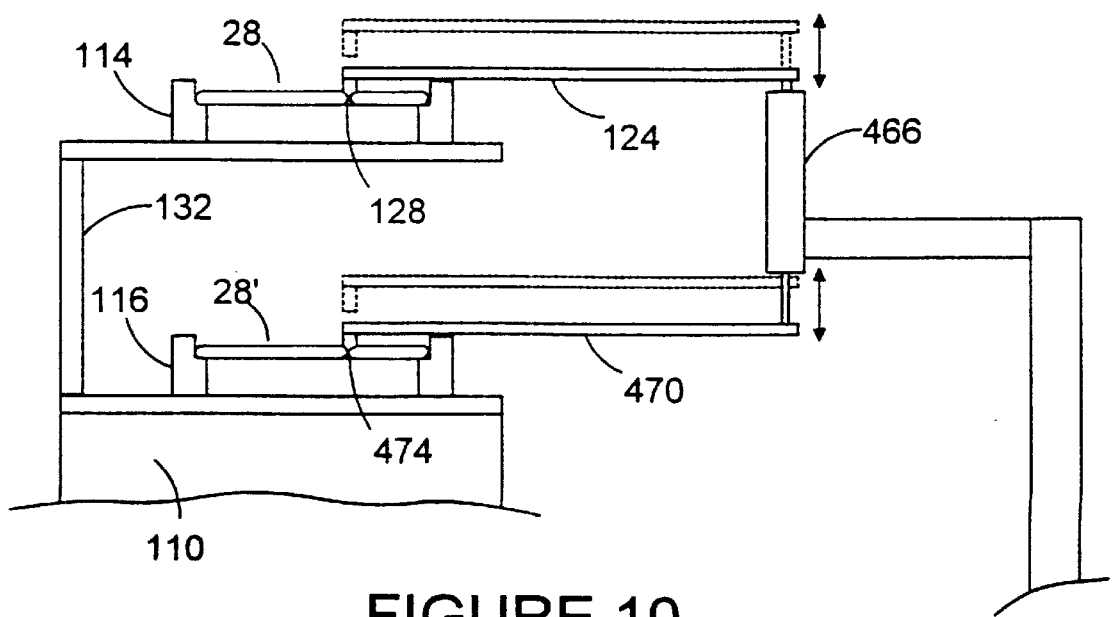
FIG. 10 is an end view of the push mechanism and input carrier of the multi-level embodiment.
Figure 9A:
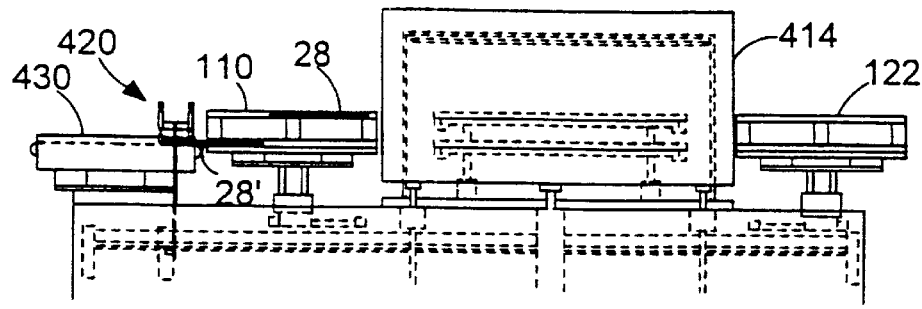
FIGS. 9a–d are explanatory partial front views of the embodiment of FIG. 6 showing processing of the PC boards.

As shown in FIG. 8, the multi-level embodiment 410 incorporates a linear drive assembly 422 as before, but a push mechanism 420 now includes first and second catch assemblies 462 and 464 having first and second catch actuators 466 and 468 which are attached not only to first and second lower catch fingers 470 and 472 (not shown) but to first and second upper catch fingers 124 and 126 (see FIG. 7) as well. The lengths of the catch fingers (470, 472, 124, and 126) are again such as to extend over the travel areas of the PC boards 28. In operation, and referring now to FIGS. 6 and 9a, and also to the end view of FIG. 10, a first catch sensor 475 present on the push mechanism 420 locates the PC board 28 as before. The first catch actuator 466 then lowers the first lower catch finger 470 such that a first catch block 474 may abut and push the PC board 28 when the linear drive assembly 422 is activated. The push mechanism 420 moves the PC board 28 onto the upper input guide rails 114 of the input carrier 110. The first vertical position actuator 112 then raises the input carrier 110 so that a second PC board 28' may be pushed onto the lower input guide rails 116. During the transfer, the upper catch fingers (124 and 126) are maintained in a raised state so that catch blocks 128 and 130 thereon do not to interfere with the first PC board 28 present on the upper guide rails 114. In addition, it will be noted that the two levels of the input carrier 110 are spaceably held apart by spacer members 132 which are located at one side of the input carrier 110 only, whereby the spacer members 132 do not interfere with the travel of the lower catch fingers (470 and 472) between the two levels. (The upper and lower chamber guide rails (118 and 452) are similarly arranged.)

Figure 9B:
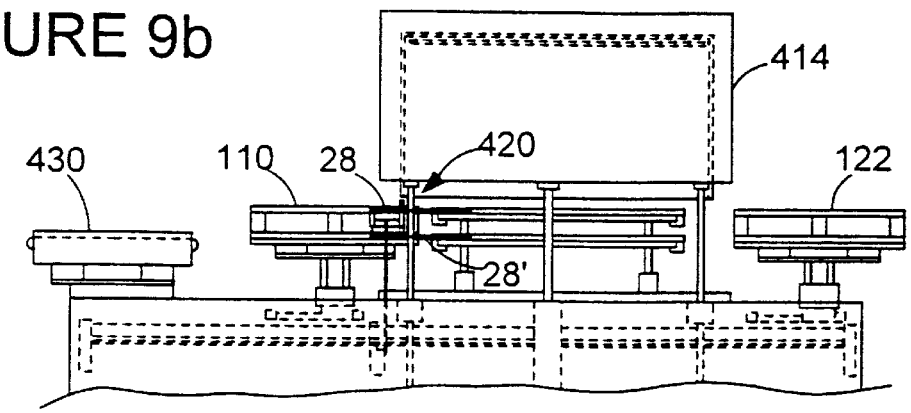

As shown in FIG. 9b, the reaction chamber 414 is lifted out of the way as before, and with the two PC boards 28 and 28' riding upon the input carrier 110, the input carrier 110 is moved by the first horizontal position actuator 432 to be in a neighboring position to the upper and lower chamber guide rails (118 and 452). The push mechanism 420 then simultaneously moves the two PC boards (28 and 28') onto the chamber guide rails (118 and 452) to a predetermined position thereon. The input carrier 110 is lowered and relocated to be adjacent to the stationary conveyor 430 so that two additional PC boards 28" and 28"' may be transported from the stationary conveyor 430 and onto the upper and lower chamber guide rails (118 and 452) as before.

Figure 9C:
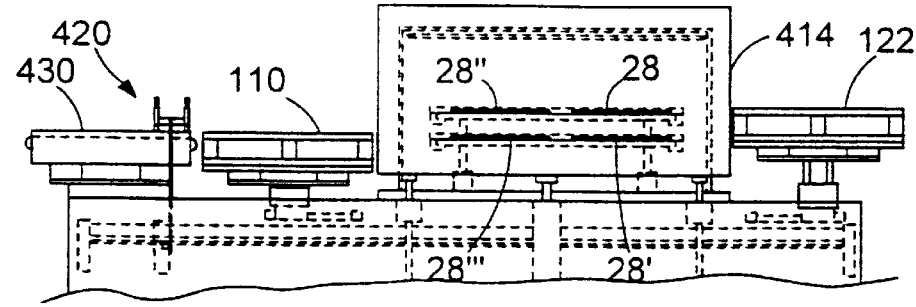
Figure 9D:
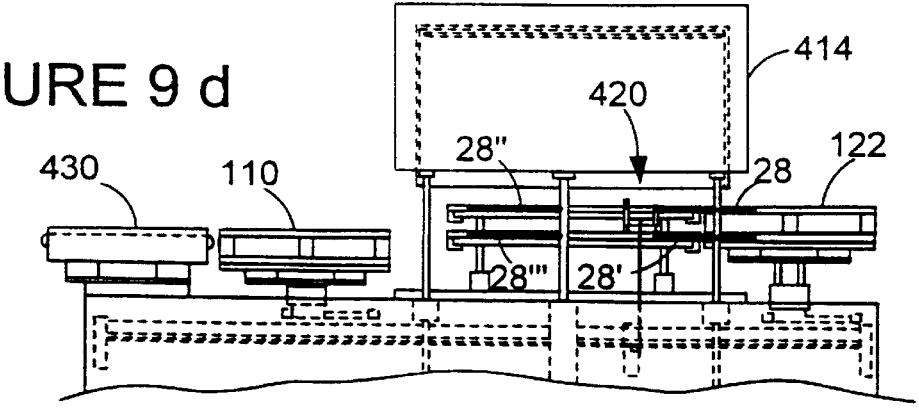

Referring to FIG. 9c, after the second pair of PC boards (28" and 28"') have been loaded, the reaction chamber 414 is lowered and the plasma treatment process is begun. Finally, as shown in FIG. 9d, after treatment and raising of the reaction chamber 414, the PC boards 28 are unloaded from the reaction chamber 414 by the push mechanism onto the output carrier 122 in reverse fashion to that previously described for the loading process (the second upper and lower catch fingers (472 and 126) being employed in the unloading process to achieve maximum push distance). Additional PC boards 28 will have already been reloaded onto the input carrier 110 to provide that throughput of the PC boards 28 through the system 410 is as rapid as possible. Thus, the input carrier 110 acts as a "buffer."

The second level of the multi-level embodiment 410 doubles the number of parts that may be treated at one time. It is apparent, of course, that additional third and fourth levels, or more, could be added to further increase the throughput of parts. In addition, the different levels need not be in arranged in stacked alignment as shown, but rather might be staggered to achieve a close packing to the limit permitted by the need for a uniform plasma reaction. (A third position actuator that provides movement in a direction perpendicular to the horizontal position actuator 432 could be incorporated into the input and output carriers (110 and 122) in order to facilitate this. Similarly, the push mechanism 420 could incorporate additional actuators to provide for a retractable horizontal extension of the catch fingers (470 and 472) over more than one travel area. Such a system could be adapted for the single-level embodiment 10, as well.)

As further levels are added, the flow of plasma between parts may become impeded. If electrodes are configured horizontally, movement of charged ions and active species will be vertical. Parts that are placed on horizontal supports or shelves in the treatment chamber tend to block plasma flow to surfaces of parts placed on intermediate levels. The end portions of parts, being more directly in the vertical flow path of the plasma, can become over-treated to the point of causing damage, while the middle portions, to which plasma flow has less easy access, can be under-treated. This results in undesirable non-uniformity.

It is possible to improve uniformity of treatment by stacking parts on edge vertically, to better correspond with the plasma flow direction. However, this has disadvantages because gravity cannot be as easily used to align parts. Parts stacked on their edges may require carriers with edge-width slots. Placement of parts in these carriers becomes more difficult, more handling may be necessary, and processing time is generally increased.

The present invention addresses these problems by providing a set of electrodes which are vertically oriented. This produces a horizontal plasma flow that is more compatible with multi-level arrangements of parts which are horizontally oriented.

Secondly, in addition to Radio Frequency (RF) excitation power, an increased DC bias is applied to the electrodes. Adding DC bias to the system increases the electric field strength, which in turn increases the energy of the ions in the plasma. This encourages a more defined directional flow of the ions from electrode to electrode, thus improving penetration of the plasma into the clearances between the stacked layers of parts. Improved penetration allows better uniformity of treatment of the parts, as the plasma is better able to contact the working surface. This improved directionality of flow also allows closer spacing of layers while maintaining good uniformity of treatment. More layers and thus more parts can be simultaneously processed in each treatment cycle, for greater manufacturing throughput.

Figure 11:
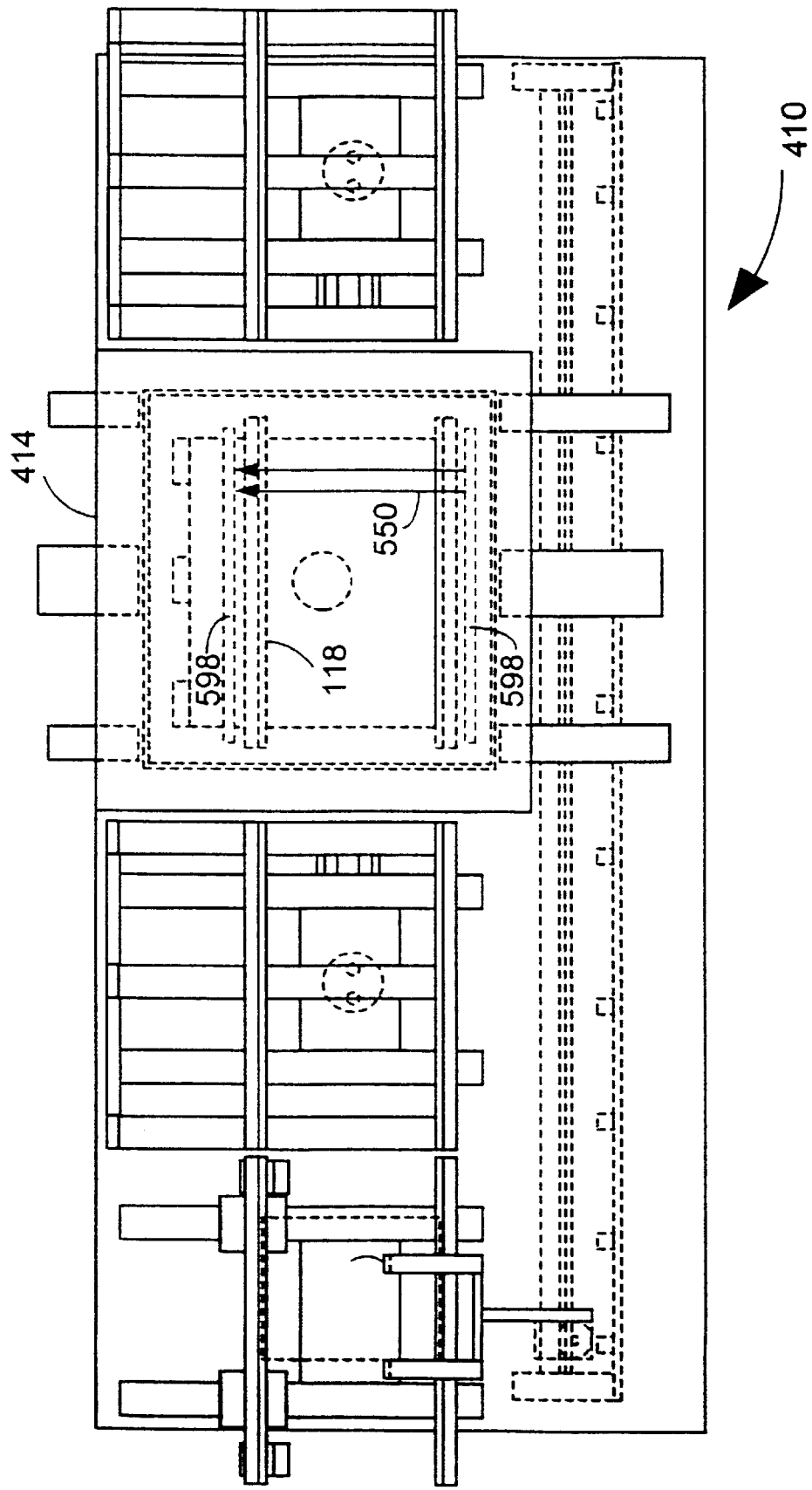
FIG. 11 is a top plan view of a multilevel embodiment which has vertical electrodes.

FIG. 11 illustrates a top plan view of a multilevel in-line plasma treatment system 410, having vertical electrodes 598. Reacfion chamber 414 contains a series of levels, each of which have associated guide rails, as in the previous description. The upper chamber guide rails 118 are shown which are ready to receive a part or substrate (not shown) in a horizontal orientation. Vertical electrodes 598 extend from the base to above the upper-most level and excite the plasma which flows in a directional manner from electrode 598 to electrode 598 as indicated by arrows 550. It should be understood that there may be considerable variation in the location and positioning of the DC bias application. For example, the DC bias need not be applied to the same set of electrodes as the RF power. There could thus be horizontal electrodes which apply the RF power and vertical electrodes which use a DC bias voltage to direct the plasma flow across the horizontal parts.

Figure 12:
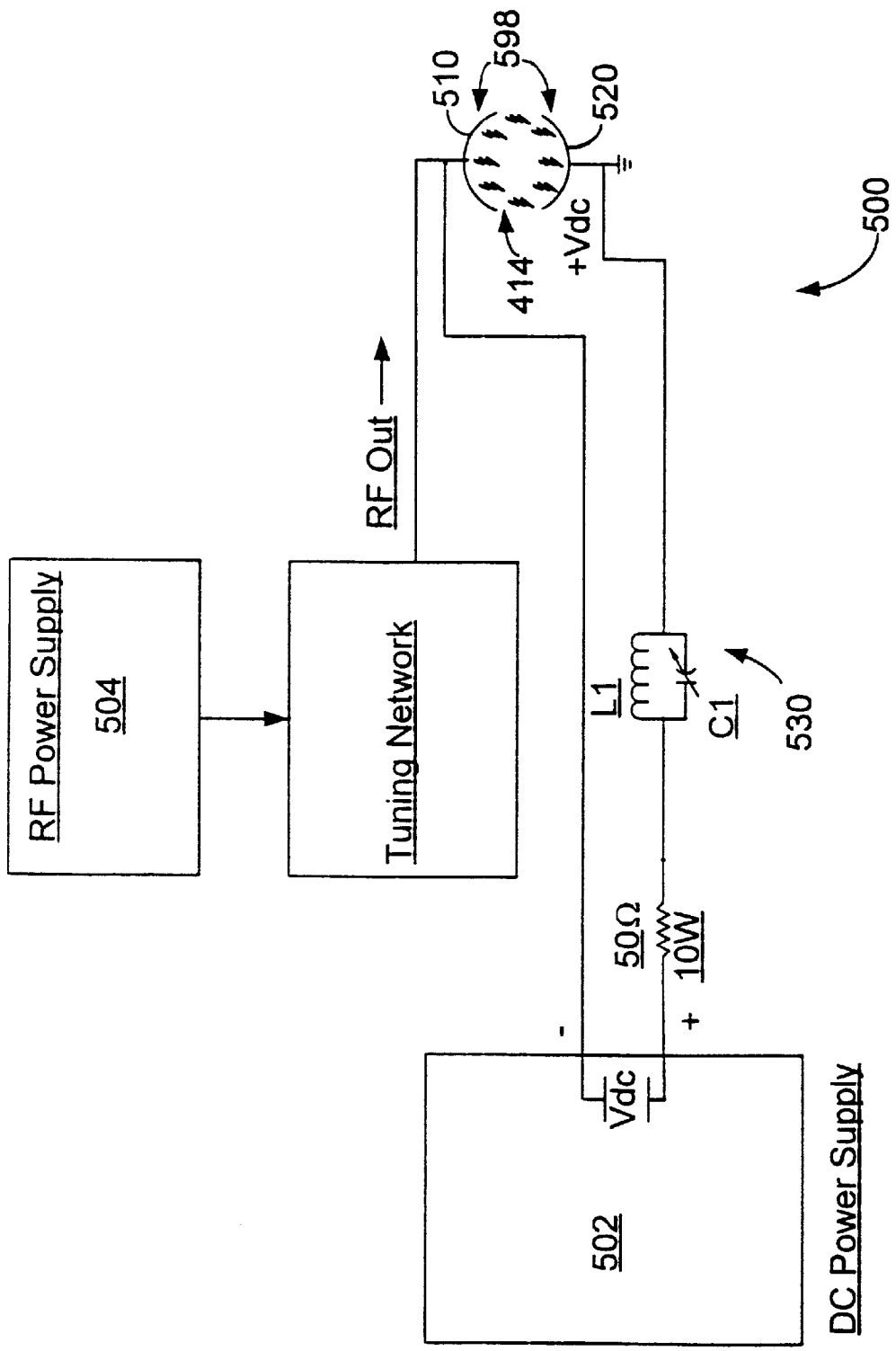
FIG. 12 is an electrical schematic of the circuits which apply RF and DC power to the plasma chamber of the present invention.

FIG. 12 illustrates the electrical circuit 500 used to power the plasma treatment system 510. The two electrodes 598 are contained within the reaction chamber 414 and include a powered shelf 510 and a ground shelf 520. A Radio Frequency power supply 504 supplies RF power to the powered shelf 510 through electrical feed-throughs (see FIG. 13). RF power flows generally from the powered shelf 510 to the ground shelf 520, and the RF power is primarily used to excite the gas to a plasma state.

Superimposed on the RF power is a DC potential. AC power is supplied to an AC input of a DC power supply 502, which supplies DC in a conventional manner. DC power is applied to the electrodes 598. The gas in the chamber has a certain electrical resistance and when a DC voltage is applied, a DC bias is created. In the preferred embodiment, the negative output of the DC supply will be connected to the RF power shelf. The positive output of the DC supply is applied to the ground shelf which shifts the RF signal by −150 volts with respect to ground. A filter 530 acts in a conventional manner as a band-reject filter to prevent RF power from flowing into the DC supply 502. It will be understood that the amount and polarity of the DC bias is subject to variation, depending on a number of factors such as the plasma species involved, the spacing of the levels, etc. and the present invention is not limited to the values disclosed here. Also, there may be considerable variation in the location and positioning of the DC bias application. For example, the DC bias need not be applied to the same set of electrodes as the RF power. There could thus be horizontal electrodes which apply the RF power and vertical electrodes which use a DC bias voltage to direct the plasma flow across the horizontal parts. Both DC and Radio Frequency excitation of plasma as used independently are well known in the art, but the inventors of the present invention are unaware of any other system which uses both DC and Radio Frequency power concurrently for plasma treatment.

As stated above, the improved directionality of flow provided by the present invention allows closer vertical placement of parts in layers which can be simultaneously treated. This opens the way for use of prefigured containers with many layers which can be loaded either while inside the reaction chamber, as in the previous embodiments, or loaded previous to placement of the containers in the chamber. These containers are known as "cassettes" or "magazines", and can be used in either in-line processing, batch-processing, or integrated into systems which use robotics to handle materials.

If used in an in-line manner, the magazines can be loaded by an automated mechanism similar to the input carrier 110 previously described (see FIG. 9). The loaded magazines can then be sent on a conveyer mechanism, to be placed in the reaction chamber, and eventually extracted and conveyed onward by an output carrier similar to the one shown as 122 in FIG. 9.

Figure 13:
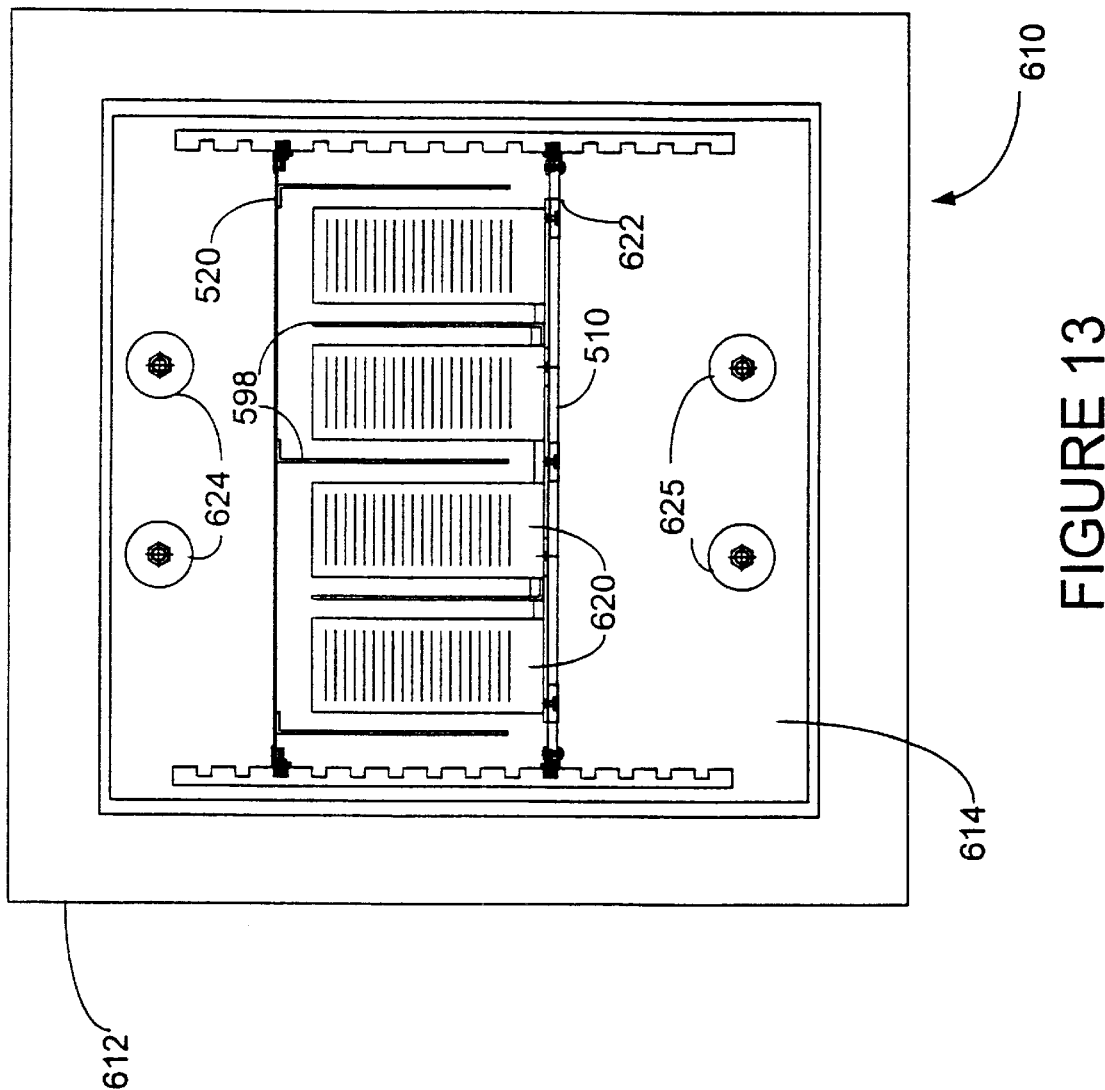
FIG. 13 is a front view of reaction chamber of the batch-processing embodiment of present invention with the front door removed.

If used in a batch-processing manner, the magazines can be used with a variety of reaction chamber configurations, which have been fitted with vertical electrodes and DC biasing circuitry, as previously described. FIG. 13 shows a third embodiment of a plasma treatment system 610, which can be used in manual batch-processing manner or used with robotic manipulation. A plasma treatment system 610 is shown, having an enclosure 612 surrounding a reaction chamber 614. A ground shelf 520 and a powered shelf 510 are shown having attached vertical electrodes 598. Magazines 620 filled with parts to be treated are shown seated on an adjustable shelf 622. The sides (not shown) of the magazines are either open or have slots fashioned to allow plasma flow to reach the parts. A DC bias applied to the powered and ground shelves serves to direct plasma flow through the magazine side slots or open sides to allow uniform treatment, in the manner previously described. The DC and RF power is input to the powered shelves by first and second sets of electrical feed-throughs 624, 625.

Figure 14:
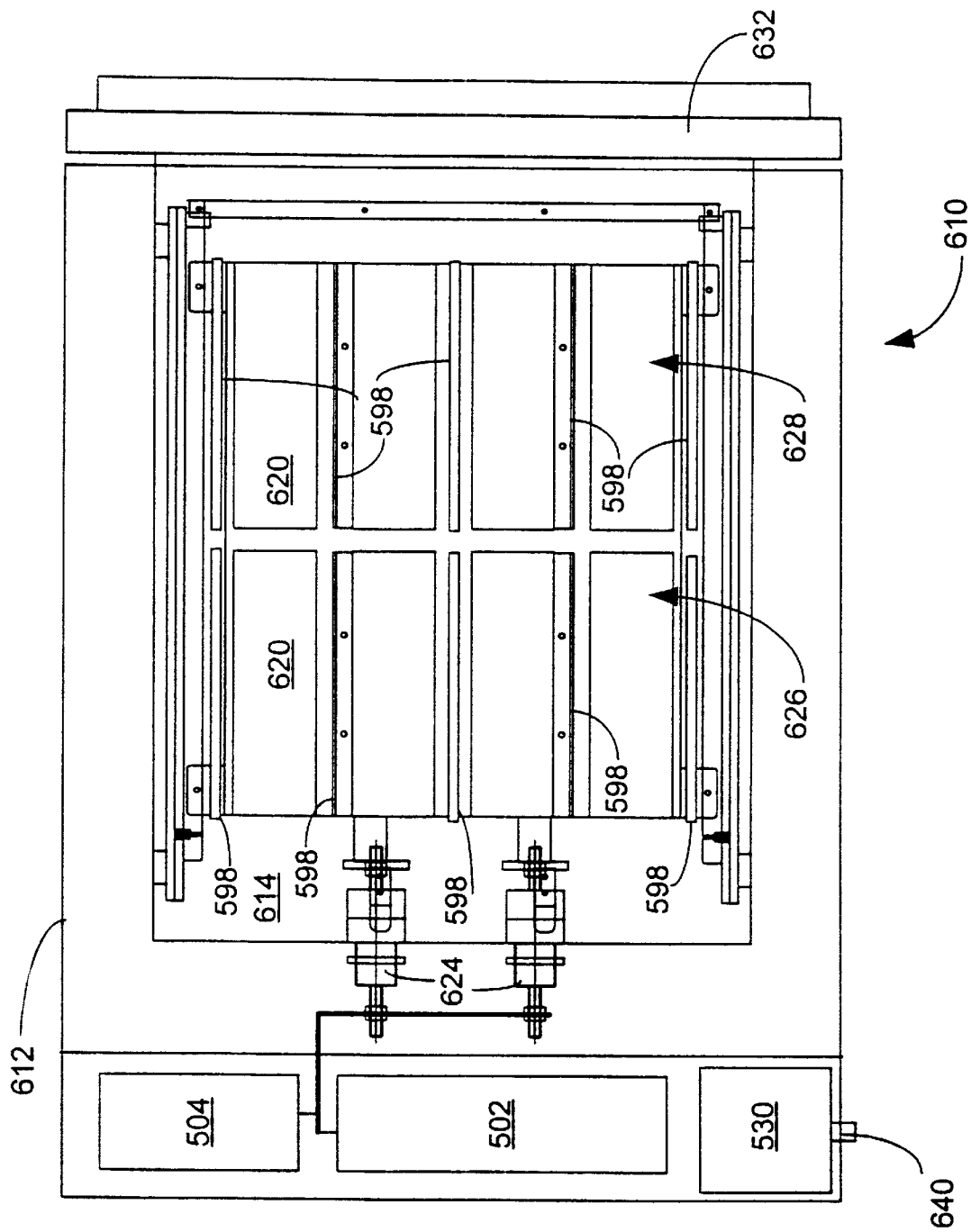
FIG. 14 is a top plan view of the batch-processing embodiment of the present invention with the top enclosure surface and the ground shelf removed.

FIG. 14 illustrates a top plan view of a plasma treatment system with the top surface of the enclosure 612 and the ground shelf 520 removed. A number of magazines 620 are shown which have been placed in two columns of four magazines. Electrodes 598 are shown in two separate banks, a first bank 626 and a second bank 628, which serve the two columns of magazines. Both the RF power supply 504 and the DC power supply 502 are connected to the electrodes 598 through the feed-throughs. In this view, only the first set of feed-throughs 624 is visible. This set 624 may be (for example) connected to the first bank of electrodes 626, which serves the first column of magazines, while the second bank 628 serves the second column. It should be appreciated that the connection between the power supplies and the electrodes could be accomplished in many different ways and more or fewer banks of electrodes and/or columns of magazines could be used. For example, one long electrode could replace the two shorter ones seen in the figure, resulting in a single electrode bank which services both columns of magazines. In this preferred embodiment, all powered vertical electrodes are connected to a central horizontal electrode.

Also shown in this view are the RF filter circuit 530 and a DC bias level adjustment 640. This adjustment 640 can be used to change the bias level to accommodate different vertical clearances between levels and differences in gas species.

In this embodiment, a door 632 is shown for front-loading of magazines 620. Although this embodiment is adapted for manual loading of magazines, it is to be understood that many other variations are possible which encompass the full spectrum of operations from strictly manual manipulation to full automated, hands-free operation. For example, the enclosure could have front and rear doors which are mechanically operated, and robotics can be used for loading, placement and conveyance of the magazines. Also, as discussed previously, the present invention can be used in either batch-processing or in-line processing configurations or any combination of the two. The present invention 10, 410, and 610 increases throughput and decreases processing time for any of these variations.

In the three preferred embodiments of the plasma treatment system (10 and 410, 610), the reaction chamber (14 or 414) is made of stainless steel with fixtures of aluminum, although other plasma-resistant materials, such as quartz may also be employed. In the preferred embodiments, the radio frequency feed-throughs 96 are protected with a conventional ceramic material.

In addition to the above mentioned examples, it is to be understood that various other modifications and alterations with regard to the types of materials used, their method ofjoining and attachment, and the shapes, dimensions and orientations of the components as described may be made without departing from the invention. Accordingly, the above disclosure is not to be considered as limiting and the appended claims are to interpreted as encompassing the true spirit and entire scope of the invention.

INDUSTRIAL APPLICABILITY

The plasma treatment system 10 of the present invention is designed to be used for the plasma treatment and cleaning of myriad types of parts and materials, including PC boards, wafers, lead frames, etc., and use of the system 10 is not limited to the electronics industry only, since plasma treatment and cleaning is equally applicable to susceptible substrates in the fields of catalysts, medical devices, plastics, ceramics, machine parts, film, optics, and even sterilization, to mention but a few possibilities. Treatment of irregularly shaped parts may be provided for by using special holders capable of traveling along the various guide rails that have been disclosed herein (or upon guide rails that have been suitably modified).

Use of the plasma treatment system 10 is simple. The in-line embodiment of the plasma treatment system 10 will generally be placed in an in-line fashion between other processing stations as part of an overall assembly process. For example, parts may travel in assembly line fashion from a curing oven to the system 10, and from there on to a wire bonding apparatus. The parameters of the particular parts to undergo plasma treatment are entered into the electronic control system 26 and the system 10 is activated to begin processing the parts.

The system 10 is completely automated, giving a hands-free operation, and provides that multiple parts may be simultaneously subjected to plasma treatment in an in-line manner. No moving parts are present during the plasma reaction process, giving the system 10 an increased life expectancy.

The plasma treatment system 610 can be used in a number of different mainers. The magazines 620 can be loaded with parts either by hand or by automated processes, such as the input carrier 110, or other robotic means. The loaded magazines 620 can then be placed in the reaction chamber 614 by manual, in-line, or robotic mechanisms. The applied DC bias power 502 which is applied to vertically oriented electrodes 598, creates horizontal flow which effectively penetrates into the clearance spaces between horizontal layers in the magazine 620, allowing more uniform treatment of parts. In addition, etching rate is increased due to the higher energy levels and the increased ionization rate. This allows more parts to be stacked closer together in a given height of magazine 620, and decreased processing time due to the increased etching rate. The throughput of the plasma treatment system 610 is thus greatly improved, whether used in a batch-processing, in-line, or robotics manipulation manner.

For these reasons and numerous others as set forth previously herein, it is expected that the industrial applicability and commercial utility of the present invention will be extensive and long lasting.

What is claimed is:

1. A system for treating parts by gas plasma reaction, comprising:
   a reaction chamber having an open bottom;
   a chamber base to which said bottom of said reaction chamber is vacuum-tightly fittable;
   lifting means for achieving vertical movement of said reaction chamber relative to said chamber base;
   a guide means capable of supporting the parts during treatment and along which the parts may be moved, said guide means being located within said reaction chamber when said reaction chamber is fitted to said chamber base;
   input carrier means capable of conveying the parts to a location neighboring said guide means;
   output carrier means capable of conveying the parts to a location removed from said guide means;
   a vertically positionable catch block capable of engageable abutment with the parts;
   a drive assembly attached to said catch block, said drive assembly capable of moving said catch block to transfer the parts from said input carrier means to and along said guide means, and from said guide means to said output carrier means; and
   gas plasma means for generating a gas plasma and inducing a plasma reaction with the parts.

2. The system of claim 1 further including
   sensor means for assisting said drive assembly in the movement and positioning of the parts relative to said guide means.

3. The system of claim 2 wherein
   said sensor means employs infrared detection.

4. The system of claim 1 wherein
   said drive assembly includes a catch actuator for raising and lowering said catch block.

5. The system of claim 4 wherein
   said drive assembly further includes a horizontally disposed catch finger having a length sufficient to extend over the travel area of the parts and to which said catch actuator and said catch block are attached.

6. The system of claim 1 wherein
   said drive assembly is a linear drive assembly.

7. The system of claim 1 wherein
   said guide means includes a chamber shelf upon which the parts may be slidably transported, said chamber shelf having a load end and an unload end, said chamber shelf being located upon said chamber base.

8. The system of claim 1 wherein
   said guide means includes a plurality of guide rail pairs arranged in a multi-level array.

9. The system of claim 8 wherein
   said input carrier means and said output carrier means each include a carrier having multiple levels capable of carrying the parts at different ones of said multiple levels, said multiple levels corresponding in number to the number of levels of said multi-level array and being spaceably distanced from and co-planarly alignable therewith.

10. The system of claim 1 further comprising
    a horizontal position actuator and said input carrier means and said output carrier means each comprising a conveyor mounted upon said horizontal position actuator for horizontal movement of said conveyor thereupon.

11. The system of claim 1 further comprising
    a vertical position actuator and said input carrier means and said output carrier means each comprising a conveyor mounted upon said vertical position actuator for vertical movement of said conveyor thereupon.

12. The system of claim 1 wherein
    said gas plasma means includes means for applying radio frequency power and means for applying DC bias power.

13. The system of claim 1 wherein
    said gas plasma means includes an electrode upon which said guide means is mounted.

14. The system of claim 1 wherein
    said gas plasma means includes an electrode which is vertically oriented.

15. The system of claim 1 wherein
    said lifting means includes a chamber lift actuator.

16. The system of claim 1 wherein
    said lifting means includes a guide rod and a pillow block for maintenance of a generally strict vertical movement of said guide rod.

17. A plasma treatment system for treating parts, comprising:
    a reaction chamber having an open bottom;
    a chamber base to which said bottom of said reaction chamber is vacuum-tightly fittable, said chamber bass having a perimeter;
    lifting means for achieving vertical movement of said reaction chamber relative to said chamber base;
    a horizontally and vertically movable input carrier;
    a horizontally and vertically movable output carrier;
    a plurality of guide rail pairs, said guide rail pairs each including two guide rails arranged in parallel to each other and being capable of supporting the parts, two of said guide rail pairs being located within a multilevel array within said perimeter of said chamber base, two of said guide rail pairs being located upon said input carrier, and two of said guide rail pairs being located upon said output carrier, said guide rail pairs located upon the input and output carriers located in a multi-level array capable of being moved into coplanar alignment with said guide rail pairs located within said perimeter of said chamber base;
    catch means for moving and positioning the parts along said guide rail pairs; and
    gas plasma means for generating a gas plasma and inducing a plasma reaction with said parts.

18. The system of claim 17 firther including sensor means for assisting said catch means in the movement and positioning of said parts along the guide rail pairs.

19. The system of claim 17 wherein said gas plasma means includes an electrode which is vertically oriented.

20. The system of claim 17 further comprising a catch block capable of engageably abutting the said parts when lowered and said catch means includes a catch actuator for raising and lowering said catch block.

21. The system of claim 17 wherein said gas plasma means includes means for applying radio frequency power and means for applying DC bias power.

22. The system of claim 17 wherein said gas plasma means includes an electrode upon which said guide rail pairs located within said perimeter of said chamber base are mounted.

23. A plasma treatment system for treating parts, comprising:

a reaction chamber;

a pair of horizontal electrodes positioned in a substantially facing and substantially parallel relationship within said reaction chamber, one of said horizontal electrodes being capable of supporting a plurality of parts arranged in a multilevel array;

at least one vertical electrode attached in electrical continuity with one of said horizontal electrodes, each of said vertical electrodes being positioned adjacent the multilevel array of parts;

a radio frequency power supply operably connected to one of said pair of horizontal electrodes for generating a gas plasma; and a DC bias power supply operably connected to said at least one of said vertical electrodes, said DC bias power enhances the interaction of the gas plasma with the parts, reduces processing time and increases system throughput.

24. The plasma treatment system of claim 23 wherein said multi-level array comprises a plurality of stacked slots in a magazine and the parts are positioned in said plurality of slots.

\* \* \* \* \*